US 6,671,183 B2

(12) United States Patent
Tsuzuki

(10) Patent No.: US 6,671,183 B2
(45) Date of Patent: Dec. 30, 2003

(54) ELECTRONIC EQUIPMENT HAVING TWO CIRCUIT BOARDS OVERLAPPING ONLY PARTLY

(75) Inventor: Koji Tsuzuki, Kariya (JP)

(73) Assignee: Denso Corporation, Kariya (JP)

(*) Notice: Subject to any disclaimer, the term of this patent is extended or adjusted under 35 U.S.C. 154(b) by 0 days.

(21) Appl. No.: 10/342,907

(22) Filed: Jan. 15, 2003

(65) Prior Publication Data

US 2003/0133280 A1 Jul. 17, 2003

(30) Foreign Application Priority Data

Jan. 17, 2002 (JP) .................................. 2002-008897

(51) Int. Cl.$^7$ .................................................. H05K 7/14
(52) U.S. Cl. ...................... 361/797; 361/752; 361/800; 361/816; 361/792; 174/35; 174/51 R; 257/99
(58) Field of Search ................................ 361/797, 752, 361/800, 796, 714, 816, 724, 730, 792, 704, 712, 696, 701, 705, 707, 708, 715, 719, 720; 174/35 R, 51; 257/99

(56) References Cited

U.S. PATENT DOCUMENTS 4,533,976 A * 8/1985 Suwa .......................... 361/736
5,461,542 A * 10/1995 Kosak et al. ................ 361/701

* cited by examiner

*Primary Examiner*—David Martin
*Assistant Examiner*—Hung Bui
(74) *Attorney, Agent, or Firm*—Harness, Dickey & Pierce, PLC

(57) ABSTRACT

Electronic equipment has two electronic circuit boards in a casing, which is constructed of a base and a cover. Two electronic circuit boards are piled up in the casing. A first electronic circuit board is, for example, for a radio communication unit, and a second electronic circuit board is, for example, for a control unit. The first board has a portion that does not face the second board. The first board is attached to the base. Heat, which is generated by the first board, conducts by heat contact from the first board to the base and the case of the casing through the contact portion of the first board with the base.

9 Claims, 2 Drawing Sheets

ELECTRONIC EQUIPMENT HAVING TWO CIRCUIT BOARDS OVERLAPPING ONLY PARTLY

CROSS REFERENCE TO RELATED APPLICATION

This application relates to and incorporates herein by reference Japanese Patent Application No.2002-8897 filed on Jan. 17, 2002.

FIELD OF THE INVENTION

The present invention relates to electronic equipment that has two electronic circuit boards, such as a telematics electronic control unit (ECU).

BACKGROUND OF THE INVENTION

Some electronic equipment for an automotive vehicle include a telematics electronic control unit (ECU). Telematics, a combination of telecommunication and informatics, is a system to provide various services of total communication integrated by the Global Positioning System (GPS), a radiotelephony, the Internet, and so on. For example, the telematics system provides a stolen-car location information service, which informs a car owner of the present location of the stolen-car, and a remote horn service, which informs a car owner of the present location of the parking car in a large parking lot by blaring a horn by remote control operation.

The telematics ECU is a terminal of mobile electronic equipment for an automotive vehicle to utilize the telematics system. To utilize the telematics system, the telematics ECU requires to stand by for receiving a radio wave communication, even when a main switch of the vehicle is turned off. Therefore, saving an electric power supply to the telematics ECU is desirable. In this aspect, it is preferred that a radio communication unit and a control unit in the telematics ECU are divided into two modules, and that the radio communication unit maintains an intermittent standby mode when the main switch is turned off. The radio communication unit communicates with an external unit via radio waves, and the control unit controls a telematics terminal operation.

Therefore, the telematics ECU is composed of two modules. One is a radio communication module, and the other is a control module. To achieve size reduction of the telematics ECU, two modules are piled up in a casing of the telematics ECU.

One example of the telematics ECU is shown in FIG. 3. In this telematics ECU, a casing 50 is composed of a base 2 and a cover 5. A radio communication unit 10 and a control unit 20 are assembled in the base 2 by screws 6.

The radio communication unit 10 is composed of a radio module board 1, a radio module shield case 4 that covers the upper and lower sides of the radio module board 1, and a joining connector 7a that is fixed to the radio module board 1. The radio module board 1 is attached to the base 2 by the screws 6. The lower side of the shield case 4 contacts the bottom of the base 2.

The radio module board 1 has an electronic circuit generating a predetermined electric power in case of transmitting radio waves. In this operation, the electronic circuit generates electromagnetic radiation and heat. The shield case 4, which is made of a metal or conducting material, shields the electromagnetic radiation generated by the radio module board 1. Moreover, the shield case 4 conducts the heat, which is generated by the radio module board 1, to the base 2 by heat conduction. The heat conduction from the shield case 4 promotes heat radiation of the telematics ECU.

The control unit 20 is composed of a vehicle interface board 3 and a joining connector 7b that is fixed to the vehicle interface board 3. The vehicle interface board 3 is overlapped over the radio communication unit 10 and attached to the base 2 by the screws 6. The joining connector 7b is joined to the joining connector 7a that is fixed to the radio module board 1. Therefore, the vehicle interface board 3 electrically contacts the radio module board 1 through the joining connectors 7a, 7b.

When the cover 5 is opened so as to look down at the radio communication unit 10, the radio communication unit 10 is completely hidden behind the vehicle interface board 3. As a result, a physical contact of the joining connectors 7a, 7b is not visible, after the radio communication unit 10 and the control unit 20 are assembled in the base 2.

The radio module board 1 is required to be readily exchangeable for a model change or an upgrade of a radio communication system. However, it is difficult to exchange the radio module board 1, because the vehicle interface board 3 prevents to exchange the radio module board 1. As a result, the telematics ECU has a maintainability problem.

Furthermore, the heat generated by the radio module board 1 conducts to the vehicle interface board 3 through the shield case 4. Therefore, the heat radiation is limited by a heat accumulation of the vehicle interface board 3, and the heat is not radiated outside substantially. To avoid the heat accumulation and to promote an efficiency of heat radiation, it is proposed to arrange the radio communication unit 10 and the control unit 20 side by side on the same plane, and both upper and lower sides of the shield case 4 contacts both the base 2 and the cover 5, respectively. However, in this arrangement, the telematics ECU is enlarged in size.

SUMMARY OF THE INVENTION

The present invention has an object to reduce size and to promote a maintainability of electronic equipment, which is composed of two electronic circuit boards. The present invention has another object to promote an efficiency of heat radiation of electronic equipment.

According to the present invention, electronic equipment is constructed of two electronic circuit boards and a casing. A first electronic circuit board is, for example, for a radio communication unit, and a second electronic circuit board is, for example, for a control unit. The two electronic circuit boards are piled up in the casing to face each other. The first board has a portion that does not face the second board. The first board is attached to the casing, and heat generated by the first board is conducted to the upper and lower sides of the casing by heat conduction through the portion.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
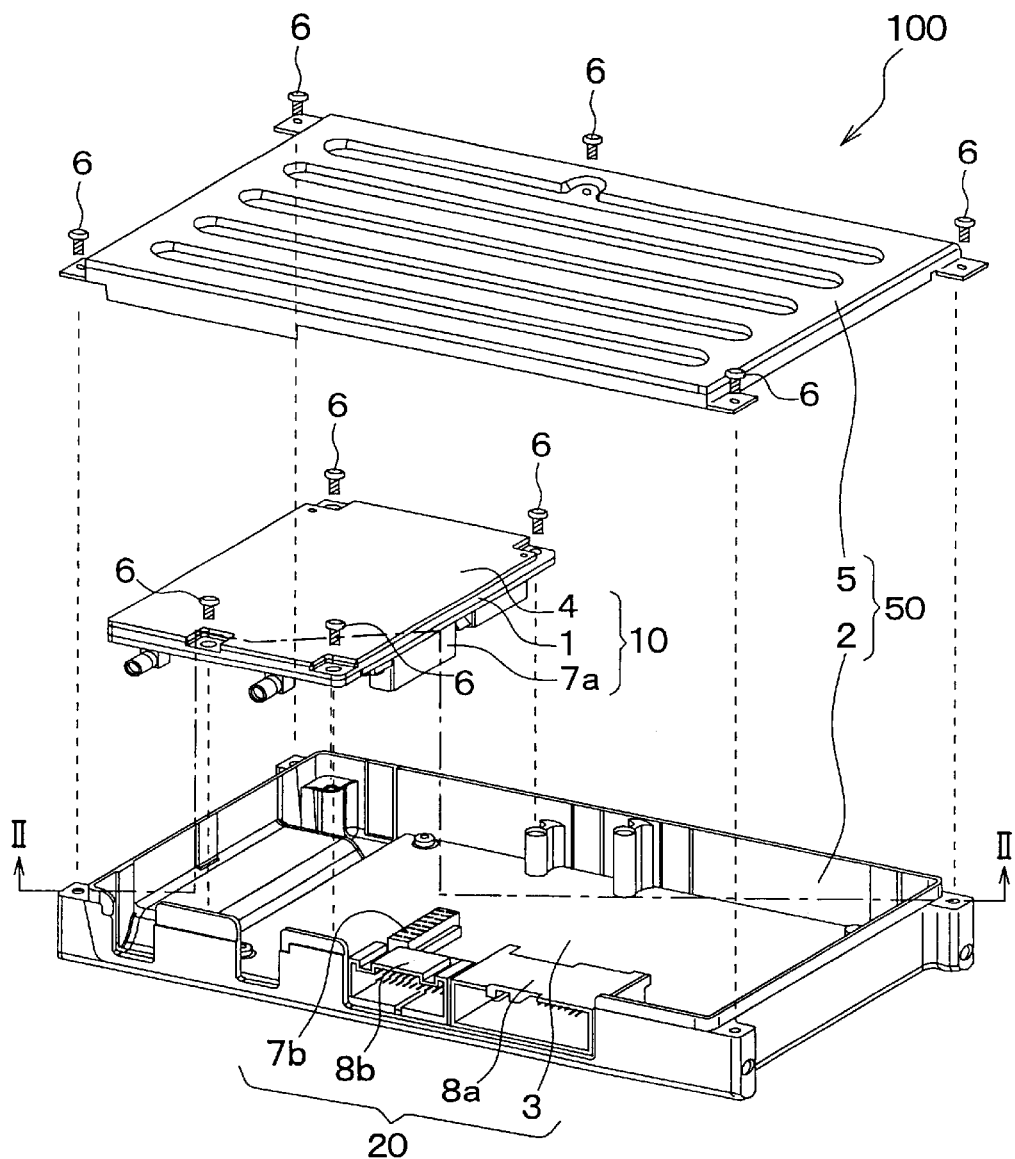
FIG. 1 is an exploded front perspective view of a telematics ECU according to an embodiment of the present invention.

Referring to FIG. 1, a telematics ECU 100 is constructed of a casing 50, a radio communication unit 10, a control unit 20, and screws 6. The casing 50, which is made of metal or conducting material, for example, aluminum alloy, is composed of a base 2 and a cover 5. The radio communication unit 10 performs a radio wave communication, and the control unit 20 controls various processing for the telematics ECU 100. The radio communication unit 10, the control unit 20, and the cover 5 are attached to the base 2 by the screws 6.

The control unit 20 is composed of a vehicle interface board 3, a joining connector 7b, and control interface boards 8a, 8b. The vehicle interface board 3 has an electronic control circuit, and the joining connector 7b is fixed to the vehicle interface board 3. The control interface boards 8a, 8b transmit and receive signals from an information system (not shown) and a control system (not shown) in an automotive vehicle, for example, GPS equipment and electric horn equipment.

The radio communication unit 10 is composed of a radio module board 1, a radio module shield case 4, and a joining connector 7a. The radio module board 1 has an electronic circuit to access external systems. The shield case 4, which is made of metal or conducting material, for example, magnesium alloy, is attached to the radio module board 1 and covers the upper and lower sides of the radio module board 1 except the edge of the radio module board 1. The joining connector 7a is fixed to the radio module board 1, and is joined to the joining connector 7b that is fixed to the vehicle interface board 3. Therefore, after assembling the radio module board 1, the radio module board 1 electrically contacts the vehicle interface board 3 through the joining connectors 7a, 7b.

Figure 2:
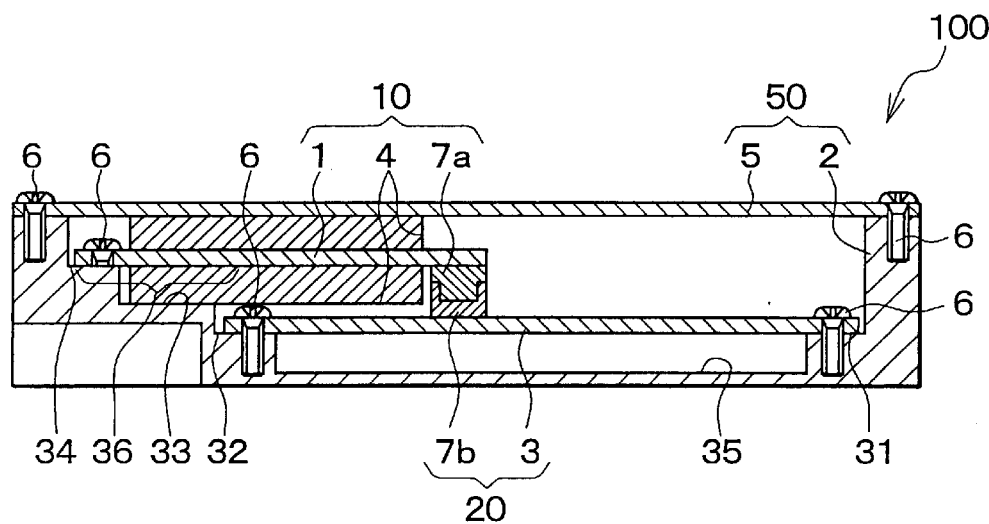
FIG. 2 is a cross-sectional view of the fully assembled telematics ECU taken along line II—II in FIG. 1.

As shown in FIG. 2, the radio module board 1 and the vehicle interface board 3 are piled up in the base 2 to face each other. The radio module board 1, which is overlapped over the vehicle interface board 3, has a non-face-to-face portion 36 that does not face the vehicle interface board 3.

The base 2 has several floors 31, 32, 33, 34, 35 that have different heights from the lower edge of the base 2. The floor 31 and the floor 32 are the same height, and the vehicle interface board 3 is attached to the floors 31, 32 by the screws 6. The radio module board 1 is attached to the floor 34. The floor 33, which is located closely to the non-face-to-face portion 36, contacts a portion of the lower side of the shield case 4. The upper side of the shield case 4 contacts the cover 5.

The telematics ECU 100 operates as follows. For example, in case of a stolen-car location information service, which informs a car owner of the present location of the stolen-car, a service center in external system requests information of the stolen-car location at first. The radio communication unit 10 receives the request signal from the service center, and sends the signal to the control unit 20. The control unit 20 responsively obtains the information of the stolen-car location from GPS equipment through the control interface boards 8a, 8b. Then, the signal of the information of the stolen-car location is reversely transmitted to the service center through the radio communication unit 10.

When the telematics ECU 100 operates to communicate the information, the radio module board 1 generates a radio wave of a predetermined electric power. In this operation, the electronic circuit in the radio module board 1 generates electromagnetic radiation and heat.

The electromagnetic radiation is shielded by the shield case 4, and the shielding effect protects other electronic devices in the telematics ECU 100 from the electromagnetic radiation.

The shield case 4 also receives the heat, which is generated by the radio module board 1, through the contact interface between the shield case 4 and the radio module board 1. The upper side of the shield case 4 is in contact with the cover 5 and conducts the heat to the cover 5 by heat conduction. The lower side of the shield case 4 also conducts the heat to the base 2 through the contact interface between the portion of the lower side of the shield case 4 and the floor 33 of the base 2. The heat, which is conducted to both the base 2 and the cover 5, is radiated to the outside of the telematics ECU 100.

Thus, the heat is generated by the radio module board 1, conducted to both the cover 5 and the base 2 by heat conduction through the shield case 4, and finally radiated to the outside of the telematics ECU 100.

Figure 3:
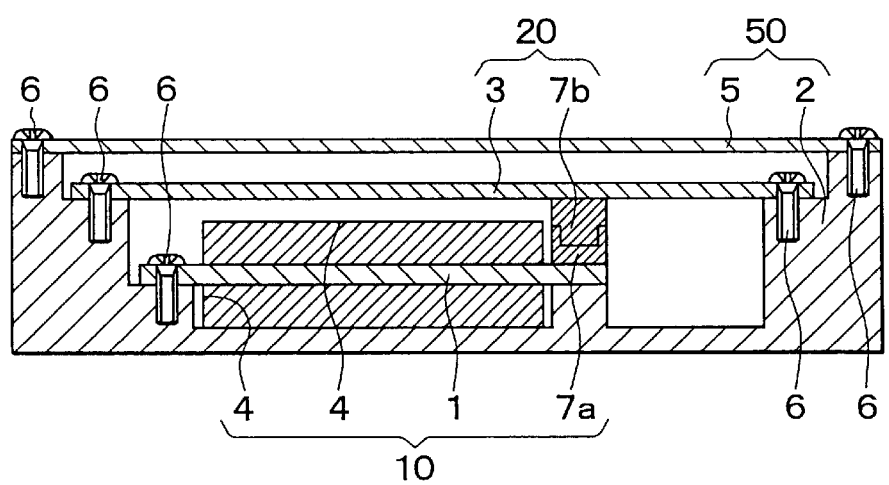
FIG. 3 is a cross-sectional view of a telematics ECU according to a related art.

The telematics ECU 100 is small in size, because the radio communication unit 10 and the control unit 20 are alternately piled up in the casing 50. Moreover, the telematics ECU 100 promotes heat radiation, because the heat conducts from the upper and lower sides of the shield case 4 to both the base 2 and the cover 5, compared with one side heat conduction in the case of the telematics ECU shown in FIG. 3. The heat accumulation of the vehicle interface board 3 is reduced, because the heat conducts from the lower side of the shield case 4 not only to the vehicle interface board 3 but also to the cover 5.

The radio module board 1, which is smaller than the vehicle interface board 3, is located more closely to the cover 5 rather than the vehicle interface board 3. Therefore, it is easy to exchange the radio module board 1 without detaching the vehicle interface board 3, and so the radio module board 1 has a quick exchangeability.

Furthermore, when the cover 5 is opened so as to look down at the radio communication unit 10, the radio communication unit 10 is substantially visible, and moreover the physical contact between the joining connectors 7a, 7b is also substantially visible. So the radio communication unit 10 has a good visibility. As a result, the maintainability of the telematics ECU 100 is promoted.

Although the present invention has been described in connection with the preferred embodiment, it is to be noted that various changes and modifications will become apparent to those skilled in the art.

For example, the above embodiment may be modified to another electronic equipment that has two electronic circuit boards in a casing, wherein one electronic circuit board generates heat. Besides, in the above embodiment, the casing 50 may be made of a heat conductive material and the radio module shield case 4 may be made of a radio shielding material.

Moreover, the above embodiment may be modified to other electronic equipment that has two electronic circuit boards, a base of a casing, and a cover of the casing. The base has two floors, wherein a first floor is higher than a second floor. The cover fixed to the base defines an accommodation space with the base. A first electronic circuit board is placed in the accommodation space and attached to the first floor at one peripheral end thereof. A second electronic circuit board is placed in the accommodation space and attached to the second floor. The first board and the second board overlap each other only partly with the other peripheral end of the first board, but the above-mentioned peripheral end of the first board does not overlap the second board.

In this modification, the electronic equipment may be further comprised of a shield case, which has upper and lower plates covering upper and lower sides of the first board, and a third floor of the base, which is provided at a height between heights of the first floor and the second floor. The upper and lower plates of the shield case are contact with the cover and the third floor, respectively. The third floor may be provided at a position where the first board and the second board do not overlap each other. Besides, the third floor may be provided outside of the second board in a lateral direction of the second board.

Furthermore, the above embodiment may also be modified to other mobile electronic equipment for a ship, a motorcycle, and a portable telephone that is easy to carry with people. Furthermore, the above embodiment may also be modified to electronic equipment for stationary equipment, for example, a home appliance and industrial control equipment.

What is claimed is:

1. Electronic equipment comprising a first electronic circuit board, a second electronic circuit board, a casing having cover and a base, and a shield case having an upper side and a lower side which are in contact with the first electronic circuit board, wherein:

the first electronic circuit board and the second electronic circuit board are piled up in the casing to face each other;

the first electronic circuit board has a portion that does not face the second electronic circuit board;

upper and lower sides of the first electronic circuit board are attached to upper and lower sides of the casing respectively;

heat generated by the first electronic circuit board is conducted to the upper and lower sides of the casing by heat conduction through the portion; and the upper side of the shield case is in contact with the cover of the casing, and the lower side of the shield case is in contact with the base of the casing.

2. Electronic equipment according to claim 1, wherein the first electronic circuit board is attached to the casing at the portion so that heat generated by the first electronic circuit board is conducted to the upper and lower sides of the casing by heat conduction through the portion.

3. Electronic equipment according to claim 1, wherein the first electronic circuit board is included in a radio communication unit for communicating with an external unit via radio waves, and the second electronic circuit board is included in a control unit for controlling a telematics terminal operation.

4. Electronic equipment according to claim 1, wherein;

the first electronic circuit board and the second electronic circuit board are accommodated in the base and covered with the cover; and the first electronic circuit board is located closer to the cover than the second electronic circuit board.

5. Electronic equipment comprising a first electronic circuit board, a second electronic circuit board, and a casing having a cover and a base, and a shield case having an upper side and a lower side which sandwich the first electronic circuit board therebetween, wherein:

the upper side is in contact with the cover of the casing and the lower side is in contact with the base of the casing;

the first electronic circuit board and the second electronic circuit board are piled up in the casing to face each other;

the first electronic circuit board has a portion that does not face the second electronic circuit board;

upper and lower sides of the first electronic circuit board are attached to upper and lower sides of the casing respectively; and heat generated by the first electronic circuit board is conducted to the upper and lower sides of the casing by heat conduction through the portion.

6. Electronic equipment comprising:

a base made of a heat conductive material and having first and second floors, the first floor being higher than the second floor;

a cover attached to the base to define an accommodation space with the base;

a first electronic circuit board placed in the accommodation space and attached to the first floor at a first peripheral end thereof;

a second electronic circuit board placed in the accommodation space and attached to the second floor, and a shield case made of a radio shielding material an having upper and lower plates covering upper and lower sides of the first electronic circuit board, respectively, wherein:

wherein the first electronic circuit board and the second electronic circuit board overlap each other only partly with a second peripheral end of the first electronic circuit board, and wherein the first peripheral end of the first board does not overlap the second electronic circuit board; and the upper plate and the lower plate of the shield case are in contact with the cover and a third floor of the base provided at a height between heights of the first floor and the second floor.

7. Electronic equipment according to claim 6, wherein:

the first electronic circuit board includes a circuit for radio communication with an external unit and a first electronic connector provided at another peripheral end thereof; and the second electronic circuit board include a second electric connector connectable to the first electric connector.

8. Electronic equipment according to claim 6, wherein the third floor is provided at a position where the first electronic circuit board and the second electronic circuit board do not overlap each other.

9. Electronic equipment according to claim 6, wherein the third floor is provided outside of the second electronic circuit board in a lateral direction of the second electronic circuit board.

* * * * *